United States Patent [19]

Kilponen et al.

[11] Patent Number: 5,732,831
[45] Date of Patent: Mar. 31, 1998

[54] ELECTRICAL APPLIANCE FRAMEWORK HAVING A THREADED BAR FOR FIXING OF COMPONENTS TO THE FRAMEWORK

[75] Inventors: Hannakaisa Kilponen; Harri Koskimäki; Esa Korhonen, all of Oulu, Finland

[73] Assignee: Nokia Telecommunications Oy, Espoo, Finland

[21] Appl. No.: 286,248

[22] Filed: Aug. 8, 1994

[30] Foreign Application Priority Data

Aug. 9, 1993 [FI] Finland .................................. 933513

[51] Int. Cl.⁶ ........................................................ A47F 7/00
[52] U.S. Cl. ............................................. 211/26; 211/13
[58] Field of Search ..................................... 211/26, 13, 1

[56] References Cited

U.S. PATENT DOCUMENTS

| | | | |
|---|---|---|---|
| 4,371,083 | 2/1983 | Zingrini et al. | 211/26 |
| 5,044,506 | 9/1991 | Brown | 211/26 |
| 5,165,770 | 11/1992 | Hahn | 211/26 |
| 5,209,356 | 5/1993 | Chaffee | 211/26 |
| 5,372,262 | 12/1994 | Benson et al. | 211/26 |
| 5,464,187 | 11/1995 | Linkner, Jr. | 248/635 |

FOREIGN PATENT DOCUMENTS

| | | |
|---|---|---|
| 4021972 | 1/1992 | Germany . |
| 1158949 | 7/1969 | United Kingdom . |
| 1214388 | 12/1970 | United Kingdom . |

*Primary Examiner*—Ramon O. Ramirez
*Assistant Examiner*—Willie Berry, Jr.
*Attorney, Agent, or Firm*—Cushman Darby & Cushman IP Group of Pillsbury Madison & Sutro LLP

[57] ABSTRACT

A threaded bar mounted in an electric appliance framework, for fixing of components to be fitted into the framework the bar is provided with threaded apertures or equivalent fixing openings for this purpose. The bar is mounted in a portion forming the outer edge of the framework to extend in the longitudinal direction thereof. The bar is inserted in the portion forming the outer edge of the framework perpendicularly to the longitudinal direction thereof.

2 Claims, 1 Drawing Sheet

5,732,831

ELECTRICAL APPLIANCE FRAMEWORK HAVING A THREADED BAR FOR FIXING OF COMPONENTS TO THE FRAMEWORK

A method for mounting a threaded bar or similar in an electric appliance framework, and an electric appliance framework

BACKGROUND OF THE INVENTION

The present invention relates to an electric appliance framework having a threaded bar or similar mounted thereto, for fixing components to the framework. The invention can be implemented particularly in connection with frameworks made of sheet metal.

Previously known are electric appliance frameworks in which two opposite walls of the framework are connected to one another with aluminium profiles. The aluminium profiles incorporate longitudinal passages for threaded bars, the bars being respectively passed through these passages at the ends of the profiles in the longitudinal direction of the profiles. If it is later desired to replace such a bar for example on account of a broken thread, the framework must usually be dismantled at one end. This also means detachment of the framework from its mounting. A framework accomplished in this manner is also expensive.

SUMMARY OF THE INVENTION

It is an object of the present invention to remove the drawbacks described above. This is achieved with an electric appliance framework having a threaded bar or similar of the longitudinal direction of the framework fitted into the portion constituted by the outer edge of the framework, the bar or similar being intended for fixing of components to be fitted into the framework and being provided for this purpose with threaded apertures or corresponding fixing openings, wherein at least one portion constituted by the outer edge of the framework has a transverse recess extending over its entire length for mounting the bar in the portion in a direction perpendicular to the longitudinal direction of said portion.

The invention is based on the idea of mounting a threaded bar or similar in an elongated space provided therefor in the lateral direction, and of forming this space to be open so as to enable mounting.

The bar can be mounted in a finished framework using a simple series of movements, and because the mounting is carried out in a finished framework, blocking up of the threaded apertures, or similar, of the threaded bar in connection with the surface treatment of the framework is avoided, and, on the whole, the provision of apertures in the sheet metal framework is made possible. On the other hand, the framework is easy to assemble and, when necessary, the bar can be readily detached from the framework and replaced without dismantling the framework or detaching it from the mounting in which it is mounted.

BRIEF DESCRIPTION OF THE DRAWING

The invention will now be explained in greater detail by means of a preferred embodiment with reference to the accompanying drawing, wherein.

DETAILED DESCRIPTION

Figures 1, 2, 3:
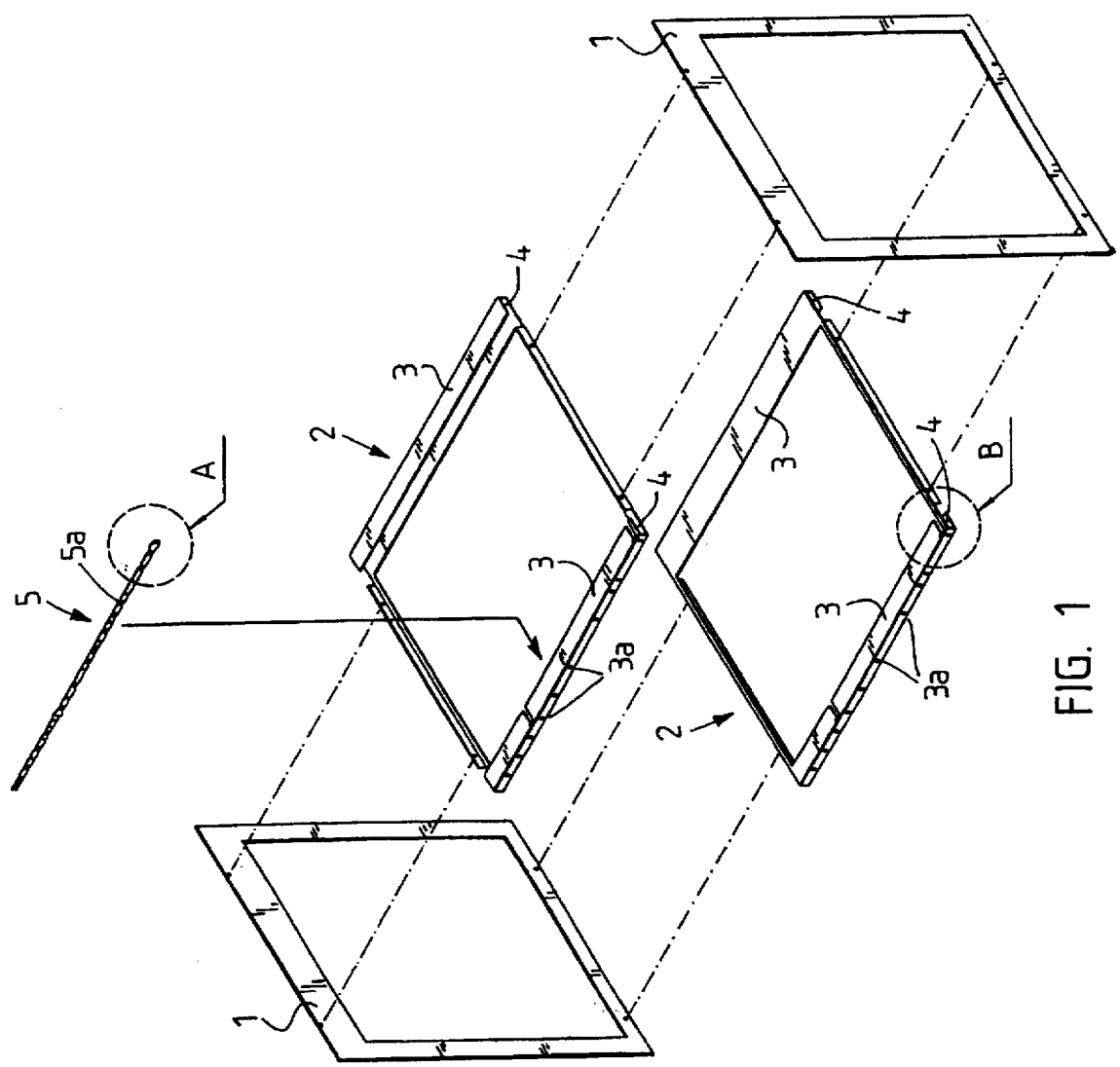
FIG. 1 shows, in blow-up view, an electric appliance/framework of the invention.
FIG. 2 shows, in enlarged view, an end of the bar shown in FIG. 1.
FIG. 3 shows, in enlarged view, an edge portion of the framework shown in FIG. 1, intended for the bar.

The electric appliance framework shown in the figures, which is preferably all sheet metal, comprises two opposite side wall portions 1 and two wall portions 2 connecting the side walls 1. The wall portions 2 form the lower and upper walls of the framework. The wall portions 2 incorporate outer edge portions 3, each having a transverse recess 4 that extends for the entire length thereof, for mounting the bar 5. The recesses 4 open up to the interior of the framework, i.e. face each other in each wall portion 2.

Each bar 5, only one of which is shown in the drawing, is intended for fixing of components or cover plates (not shown in the drawing) to be fitted into/to the framework and is provided with fixing openings 5a (FIG. 2) for this purpose. The fixing openings cooperate with screws or similar fixing means (not shown) to be mounted through apertures 3a provided in the outer edge portions 3 of the framework, for securing the fixing means in place. The fixing openings 5a may also be shaped as threaded apertures, and, in that case, the bar can be termed a threaded bar. Yet, when the bar 5 is made of sheet metal, as in this exemplary it is advantageous to employ the aperture design shown in FIG. 2, which functions similarly as a threaded aperture. The bar 5 is advantageously manufactured of stainless steel, but it may also be made of cold-rolled steel if the bar does not necessitate apertures of the kind described above but, for example, oval apertures or similar for various rapid fasteners.

When the framework is assembled, the wall portions 1 and 2 are first adjoined to form a framework structure, which is followed by the possible surface treatment of the framework. Thereafter, each bar 5 is inserted in place in the bottom of the recess 4 in a direction perpendicular to the longitudinal direction of the recess 4, i.e., in this case, in the plane of each wall portion 2 from the inside of the framework. This is illustrated by the arrows in the figure. It is of advantage that the mounted bar 5 be free to move in the recess to some extent, which will avoid problems caused by too tight tolerances. In other words, the recess 4 is oversize in transverse cross-sectional size, relative to the bar 5, so that prior to being secured in the recess 4, the bar 5 fits loosely in the recess 4.

The description herein is only intended to illustrate the inventive concept. Those skilled in the art may implement the details of the invention in a variety of alternative ways within the scope of the appended claims. Thus the bars 5 may be mounted in any desired outer edge of the framework, for instance, which at any rate was difficult to achieve in the prior art constructions.

We claim:

1. An electric applicant framework, comprising:
   a plurality of framework elements arranged in an array having outer edges disposed on opposite sides of a median;

at least one of said framework elements being provided at a respective said outer edge of said array, with a recess which extends throughout the length of the respective said outer edge and opens towards said median;

a bar received by installation in a direction transverse to said length in at least one said recess so as to extend lengthwise of the respective said outer edge, said bar being provided along the length thereof with a series of fixing openings which are accessible transversely of the length of said bar, for securing components to the framework using fasteners;

said fixing openings being configured for threaded reception of threaded fasteners;

said recess being oversize in transverse cross-sectional size relative to said bar, so that prior to being secured in said recess, said bar fits loosely in said recess; and openings formed through said at least one framework element at a respective said outer edge of said array, for reception of threaded fasteners for securing said bar in the respective said recess.

2. The electric appliance framework of claim 1, wherein: said bar is made of sheet metal.

\* \* \* \* \*